United States Patent
Chen et al.

(10) Patent No.: US 6,297,661 B1
(45) Date of Patent: Oct. 2, 2001

(54) SEMICONDUCTOR SWITCH FAULT DETECTION

(75) Inventors: Chingchi Chen, Ann Arbor; Venkateswara Anand Sankaran, Farmington Hills, both of MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/294,071

(22) Filed: Apr. 19, 1999

(51) Int. Cl.[7] .................................................. G01R 31/26
(52) U.S. Cl. ............................................................ 324/769
(58) Field of Search ........................... 324/769, 763, 324/765, 768, 537

(56) References Cited

U.S. PATENT DOCUMENTS

| | | |
|---|---|---|
| 3,445,769 | 5/1969 | Erath . |
| 3,588,697 | 6/1971 | Cook . |
| 3,622,883 | 11/1971 | Haire . |
| 3,636,450 | 1/1972 | Griffin . |
| 3,648,170 | 3/1972 | Embree et al. . |
| 3,965,420 | 6/1976 | Bennett . |
| 4,010,418 | 3/1977 | Salvatore . |
| 4,538,106 | 8/1985 | Anderson . |
| 4,701,701 | 10/1987 | Takagi . |
| 5,598,101 | 1/1997 | Den Dekker . |
| 5,966,024 | * 10/1999 | Bui ............................... 324/763 |

* cited by examiner

*Primary Examiner*—Safet Metjahic
*Assistant Examiner*—J Kerveros
(74) *Attorney, Agent, or Firm*—Mark L. Mollon; William J. Coughlin

(57) ABSTRACT

A system and method for detecting various fault conditions in semiconductor devices. A variable voltage reference is compared to the voltage output of the device during device turn-on to detect circuit fault conditions. The fault condition is then communicated to a controller.

12 Claims, 3 Drawing Sheets

US 6,297,661 B1

SEMICONDUCTOR SWITCH FAULT DETECTION

FIELD OF THE INVENTION

The present invention relates to semiconductor switches and more particularly to detection of fault conditions in semiconductor switches.

BACKGROUND OF THE INVENTION

Semiconductor switches, such as Insulated Gate Bipolar Transistors (IGBT), Metal Oxide Semiconductor Field Effect Transistors (MOSFET), and diodes are widely used in various power electronic systems. These devices have precise ratings and are prone to failure under abnormal conditions, such as over-current/voltage, excessive temperature, bad gate drive, and turn on/off at the wrong instances. Also, the devices deteriorate over time due to wear out mechanisms and eventually fail, especially under heavy load and wide temperature/power excursions.

Under generally normal conditions, the turn-on process of semiconductor switches includes three stages, as illustrated in FIG. 1. First, there is a time delay $t_d$ from when the control signal (gate signal) is applied to when the device starts to respond. After $t_d$, the device's switch voltage/current goes through a fast transition period, and this interval is normally named rise/fall time ($t_f$). Finally, the on-state voltage of the device may exhibit a long voltage tail before reaching a steady-state final value. This turn-on process and the final on-state voltage are very important indicators as to how well the circuit operates and how healthy the semiconductor device is.

The switching wave forms and the on-state voltage can be badly distorted under fault conditions. The first potential fault condition is shoot through. It occurs when one or more semiconductor switches are turned-on when as a stiff voltage source is imposed across the devices. Under this condition, the current passing through the devices can be over ten times the rated current of the devices, and the voltage across them is very high. Under this fault condition, the devices can be destroyed in tens of microseconds unless proper action is taken. FIG. 2 illustrates a typical wave form, showing the gate signal, switch voltage and current, through a device during a shoot-through condition. One will note that both the switch voltage and the switch current are very high. To address this concern, generally current or preferably voltage sensors are employed to detect such a catastrophic condition.

One particular system employed to address the shoot-through problem configures a circuit so that a device on-state voltage is compared to a fixed voltage reference. When the on-state voltage exceeds a certain value, a flag is raised to reflect that fault has occurred. However, to avoid nuisance flags caused by device turn-on transient voltage tail under normal process conditions, the voltage reference in this system cannot be set too low. The voltage reference must be set at least a few times the rated on-state voltage drop, which makes this system only useful for catching disastrous or significant faults. It will miss faults that occur at lower levels of voltage.

Another fault condition that can occur is over-current. Due to over-load or short-circuit through low-impedance conditions, the current can surpass the ratings of the devices and impose excessive stresses. The only practical way to detect the over current conditions is by current sensing since even under one hundred percent over-current conditions, the on-state voltage may be less than twice the rated on-state voltage. Voltage detection to determine this type of fault is impractical, and so a difficulty arises in detecting this type of fault with a typical general fault detection arrangement.

Still another type of condition that may occur and eventually lead to a fault is device deterioration. Under heavy loads and excessive temperature/power excursions, solder layers, internal interconnections (e.g. wire bonds) and semiconductor cells gradually deteriorate and eventually cease functioning. All of these phenomena lead to a reduction in the usable area. Due to this, the current density through the remaining functioning cells gradually increases, which increases power loss, speeds up the deterioration process, and increases the on-state voltage drop. FIG. 3 illustrates a graph of the on-state voltage of a typical IGBT device as a function of time when cycled by rated load. The graph shows how the voltage rises over time, but this condition is still very hard to detect because the voltage change is not significant when compared to a shoot through condition (i.e., only about twenty percent), even when the device may be close to total failure. It is desirable to have an effective on-line device that can detect this device deterioration condition.

Another fault condition that occurs and so needs to be detected is a gate drive failure. Due to the improper design of a circuit or component failure, the gate drive circuit may not provide enough capability to properly drive the semiconductor switches. This can cause excessive switching loss due to slower turn-on/off processes, and elevated conduction loss since the on state voltage drop is higher. While this condition can be detected by monitoring the device turn-on process or gate drive outputs, it adds additional cost and complexity.

Thus, it is desirable to provide a system and method for accurately detecting the various types of fault conditions for these switches, while minimizing the cost and complexity for this detection. Consequently, this invention provides a simple system and method to monitor the on-state voltage to adequately detect all the above mentioned fault conditions.

SUMMARY OF THE INVENTION

In its embodiments, the present invention contemplates a method for detecting fault conditions in a semiconductor device with its voltage drop signal that produces a voltage signal during device turn-on. The method comprises the steps of: creating a variable reference voltage at device turn-on; exponentially decaying the reference voltage over time down to a final reference value; comparing a voltage from the device to the variable reference voltage; and generating a fault condition for the device if the variable reference voltage drops below the device voltage.

The present invention further contemplates a system for detecting fault conditions in a semiconductor device having a gate signal and voltage source, and being in communication with a controller. The system includes a variable voltage reference generator, a means for comparing a voltage from the device to the variable reference voltage, and a time delay means for time delaying the gate signal. An AND gate receives a signal from the means for comparing and the time delay means, and a controller receives the output from the AND gate and reports a fault condition based upon the output.

Accordingly, an object of the present invention is to provide a system and method to detect several fault conditions of semiconductor switches.

By monitoring the voltage drop across the switch during on-state and comparing to a time varying voltage reference, fault conditions such as shoot-through, over-current, deteriorating semiconductor devices and gate drive failure can be detected. Also, the usable life of the switches in real time can be tracked, allowing for corrective action to be taken before a device actually fails due to deterioration.

An advantage of the present invention is that several different circuit faults in a semiconductor switch can be detected with one simple circuit.

Another advantage of the present invention is that the detection circuit can monitor the semiconductor swatch aging process on-line.

DETAILED DESCRIPTION OF THE PREFERRED EMBODIMENTS

Figure 1:
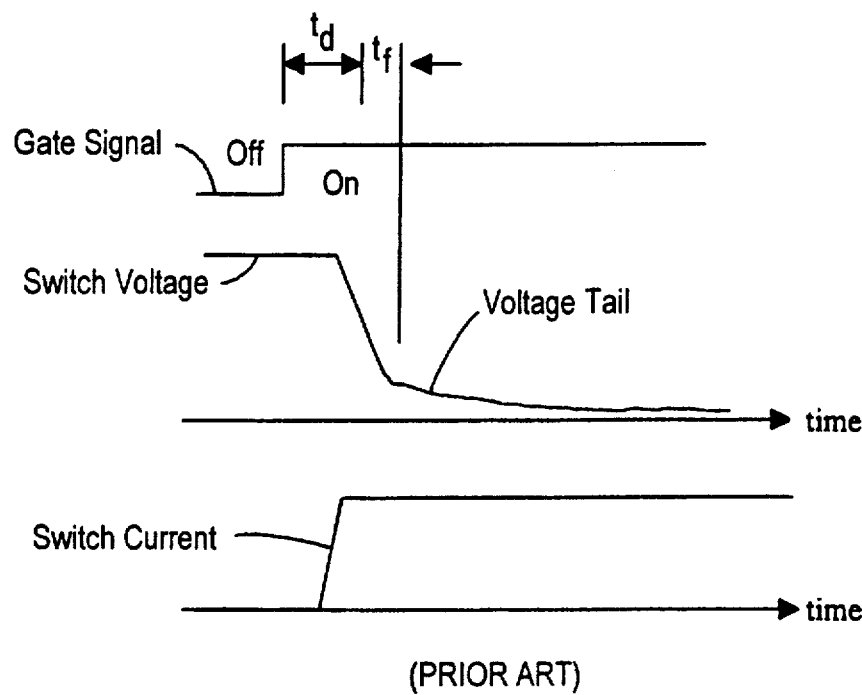
FIG. 1 is a graphic illustration of a typical turn-on process for properly working semiconductor devices.
Figure 2:
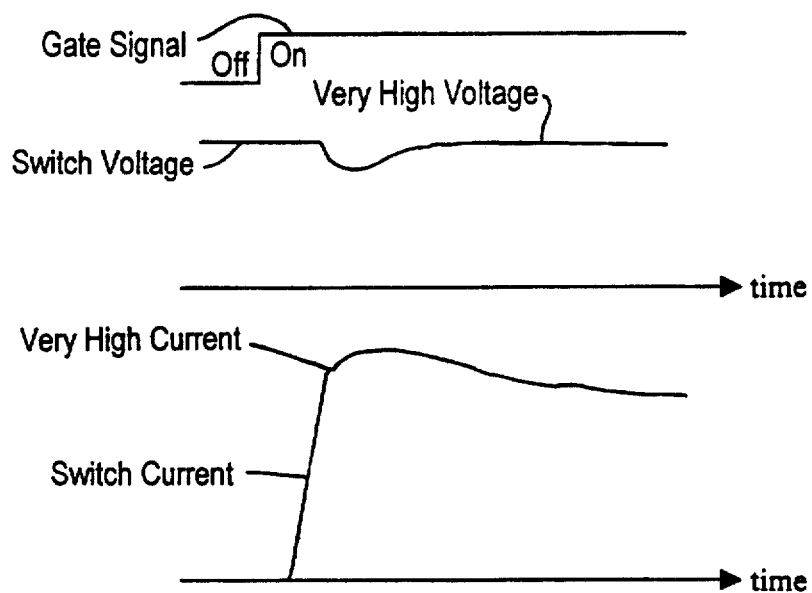
FIG. 2 is a graphic illustration of a typical turn on process for a semiconductor experiencing a shoot-through fault condition.
Figure 3:
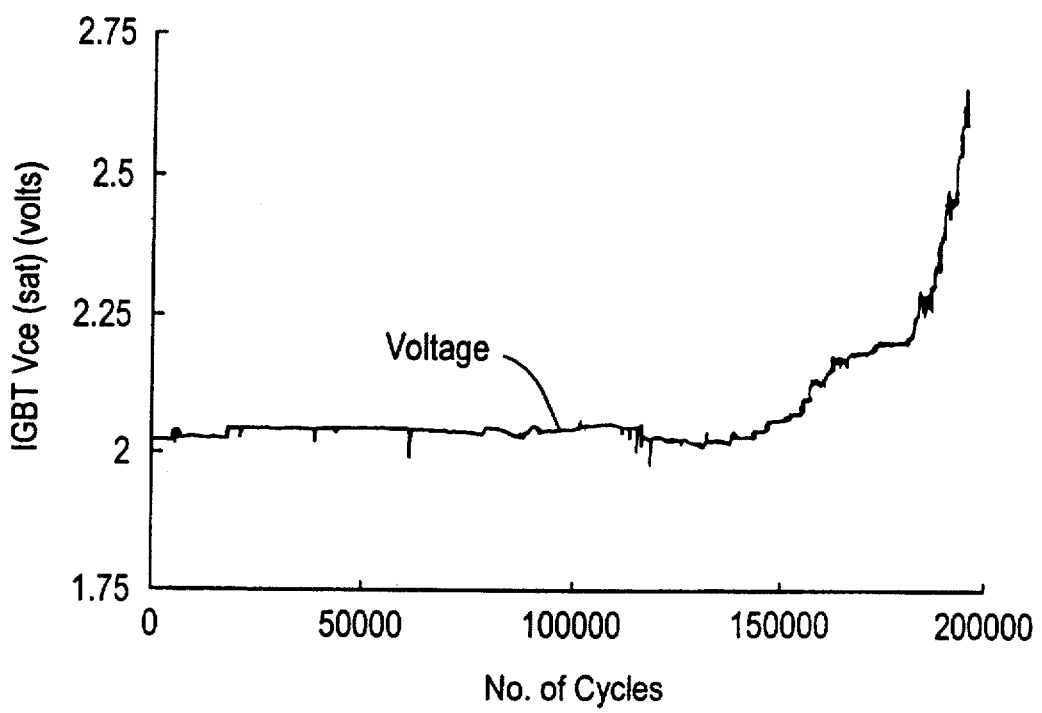
FIG. 3 is a graphic illustration of an on-state voltage as a function of the number of cycles when an IGBT semiconductor device is under full load stress.
Figure 4:
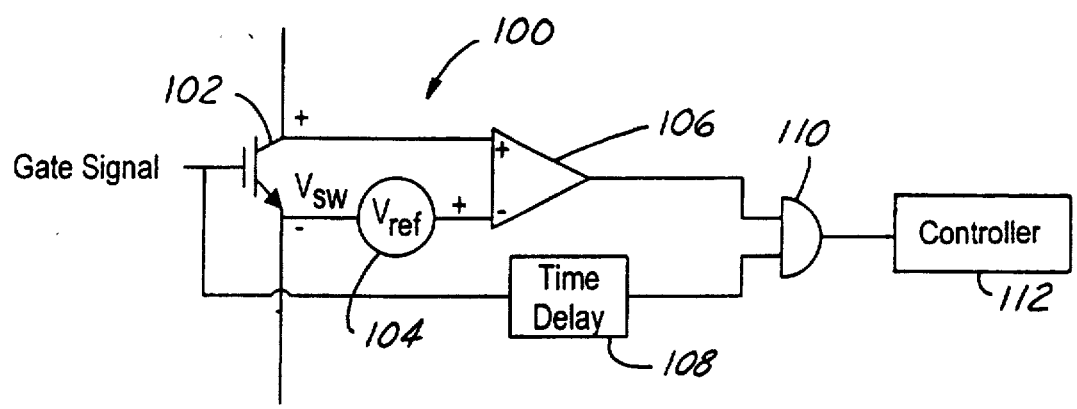
FIG. 4 is a schematic illustration of a circuit for detecting circuit faults in accordance with the present invention.

FIG. 4 illustrates a circuit 100, connected to a switch 102, for detecting switch fault conditions. The circuit 100 includes a variable voltage signal generator 104, and a comparator 106 receiving inputs of the switch turn-on voltage and the generator 104. A time delay circuit 108 is connected between the gate signal and an AND gate 110. The output of the comparator 106 is also connected to the input of the AND gate 110. The output of the AND gate 110 is received by a controller 112. The controller 112 includes a routine to take corrective action when a circuit fault condition is detected.

Figure 5:
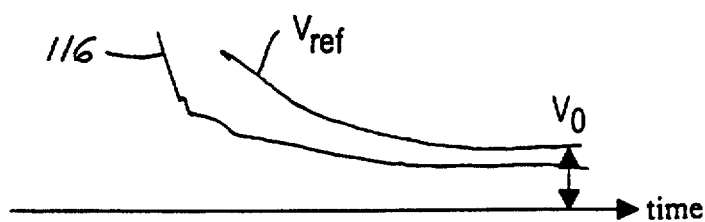
FIG. 5 is a graphical illustration of a switch turn-on voltage compared to a moving reference voltage to monitor a device turn on process in accordance with the present invention.

FIG. 5 illustrates the method employed by the circuit of FIG. 4 to detect the different fault conditions that may occur in the switch 102. Example of what typically the device terminal voltage 116 over time will look like for a properly working switch is illustrated. The voltage reference $V_{ref}$ is illustrated. It varies over time as $V_{ref}=V_0+\Delta V*e^{-t/\tau}$, where $V_0$ is a final reference value and $\Delta V*e^{-t/\tau}$ is an exponentially decaying term that creates a moving reference to compare to the actual terminal voltage 166 of the semiconductor switch 102. The voltage $\Delta V$ is a voltage difference that sets the initial acceptable value of voltage above $V_0$. The term t is the time from the reference voltage starting to decay, and $\tau$ is a time constant for determining the rate of exponential decay of the reference voltage.

The profile of the moving reference $V_{ref}$ can be chosen to fit the characteristics of the particular device being monitored. In this equation for varying the reference voltage, $\Delta V$ should be chosen high enough to avoid nuisance tripping, and the final value for $V_0$ is best set only slightly higher than the normal on-state voltage to catch even very mild over-current conditions. The time constant $\tau$ is preferably set so that the reference profile for $V_{ref}$ follows the turn-on voltage contour of the device. Therefore, any abnormal voltage conditions for the semiconductor device during the entire turn-on process can be detected, including the fault conditions of shoot through, over-current, and gate drive failure.

The circuit 100 for detecting fault conditions works by comparing the device turn-on voltage over time to the moving voltage reference $V_{ref}$. When the on-state voltage 116 exceeds the moving reference value, a flag is raised to reflect a fault condition. This fault status flag stays high when the voltage of the switch 116 is greater than the reference voltage $V_{ref}$. The flag is communicated to the controller 112 so that corrective action can be taken.

T0 The time delay function 108 before the AND gate 110 is used to avoid a nuisance trip due to the inherent turn-on delay of the active switch 102, and the time-varying voltage reference $V_{ref}$ is used to adapt to the natural turn-on process of the switch 102. With a high reference voltage initially, the elevated leading edge of the normal turn-on process can be accommodated without fault tripping. However, in case of a shoot-through condition, the device voltage 116 will be much higher than the acceptable range; therefore, it can be easily caught by the circuit 100. If the first stage of the turn-on process passes examination, the reference voltage $V_{ref}$ continues to drop, again following the acceptable turn-on profile of the device. At this time, if there is a short circuit condition, the device terminal voltage 116 will not drop fast enough to pass the criteria of the varying reference $V_{ref}$, and again, the fault condition will be detected very quickly after the device 102 is turned on. Further, with deteriorating devices or unhealthy gate drives, the final on-state voltage across the device is likely out of range, and higher than the final voltage reference $V_{ref}$ set by the criteria, and will trip the fault flag. In short, this strategy to detect faults proposes a variable voltage reference $V_{ref}$ to provide a means to detect different fault conditions that may occur during the turn-on process.

Figure 6:
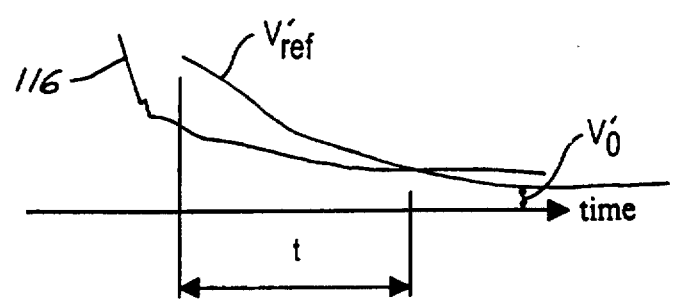
FIG. 6 is a graphical illustration of a switch turn-on voltage compared to a moving reference voltage with low base voltage $V_0$ in accordance with another embodiment of the present invention.

FIG. 6 illustrates an alternate embodiment of the present invention, where the varying reference voltage $V'_{ref}$ is set differently to detect the fault conditions. For this embodiment, the final reference voltage $V'_0$ is set below the nominal on-state voltage of the semi-conductor device 102. Consequently, at some time during the turn-on process, the device on-state voltage 116 will drop below the reference voltage $V_{ref}$ and assert the status flag. The flag signal is caught by the controller 112 and the time t for this flag to be asserted is measured. Now, with $V_0$, $\Delta V$ and $\tau$ known, the device terminal voltage 116 at that time is calculated, with the time t as the measurable Parameter. This method works well because the exponential profile decays slower after a few time constants, so the practical sensing resolution becomes higher. This is because a small variation of the device voltage alters the cross-over time of the reference voltage significantly. Thus, very small voltage variation due to device aging are detected, allowing for detection of device fatigue in its early stages. The controller 112, then, is programmed to provide diagnostic alerts that a semiconductor device may need replacement.

Additionally, this method of fault detection can handle statistical variation in on-time voltage drop of the device. In order for detecting small variations of the device on-state voltage from and accommodated statistical variation in on-state voltage from part-to-part, information is needed on the current flowing through the device. Phase current information is available from inverters employed for other control purposes and can be used for this purpose. This information will be fed back to the controller. A ripple in the phase current wave form is not an issue since it does not need very precise device current information.

While certain embodiments of the present invention have been described in detail, those familiar with the art to which this invention relates will recognize various alternative designs and embodiments for practicing the invention as defined by the following claims.

We claim:

1. A method for detecting fault conditions in a semiconductor device with its voltage drop signal that produces a voltage signal during device turn-on, the method comprising the steps of:

creating a variable reference voltage at device turn-on;

exponentially decaying the reference voltage over time down to a final reference value;

comparing a voltage from the device to the variable reference voltage; and generating a fault condition for the device if the variable reference voltage drops below the device voltage.

2. The method of claim 1 wherein the step of generating a fault condition includes generating the fault condition only if the device variable reference voltage drops below the device voltage during a predetermined time interval.

3. The method of claim 1 further including the step of communicating the generated fault condition to a controller.

4. The method of claim 1 wherein the step of creating a variable reference voltage includes creating an initial reference voltage made up of the sum of a final reference voltage, that is set greater than a final value of the device voltage, and a difference voltage, that sets an initial acceptable voltage over the final reference voltage.

5. The method of claim 4 wherein the step of exponentially decaying includes exponentially decaying the voltage difference after the device turn-on.

6. The method of claim 1 wherein the step of creating a variable reference voltage includes creating an initial reference voltage made up of the sum of the final reference voltage, that is set less than a final value of the device voltage, and a difference voltage, that sets an initial acceptable voltage over the final reference voltage.

7. The method of claim 6 further including the steps of measuring an elapsed time from device turn-on until the reference voltage drops below the device voltage, and determining a deterioration of the semiconductor device based upon the elapsed time.

8. A method for detecting fault conditions in a semiconductor device comprising the steps of:

creating a variable reference voltage at device turn-on;

exponentially decaying the reference voltage over time down to a final reference value;

comparing a voltage from the device to the variable reference voltage; and generating a fault condition for the device if the variable reference voltage drops below the device voltage before a predetermined time has passed.

9. The method of claim 8 further including the step of communicating the generated fault condition to a controller.

10. The method of claim 8 wherein the step of creating a variable reference voltage includes creating an initial reference voltage made up of the sum of the final reference voltage, that is set less than a final value of the device voltage, and a difference voltage, that sets an initial acceptable voltage over the final reference voltage.

11. A system for detecting fault conditions in a semiconductor device having a gate signal and voltage source and being in communication with a controller, the system comprising:

a variable voltage reference generator;

a means for comparing a voltage from the device to the variable reference voltage;

a time delay means for time delaying the gate signal;

an AND gate for receiving a signal from the means for comparing and the time delay means; and a controller for receiving the output from the AND gate and reporting a fault condition based upon the output.

12. The system of claim 11 wherein the variable voltage reference generator includes means for creating an exponentially decaying reference voltage.

* * * * *